(12) United States Patent
Lee et al.

(10) Patent No.: US 8,470,703 B2
(45) Date of Patent: Jun. 25, 2013

(54) SEMICONDUCTOR DEVICE AND METHOD OF FABRICATING THE SAME

(75) Inventors: Byung-Hak Lee, Hwaseong-si (KR); Yu-Gyun Shin, Seongnam-si (KR); Sang-Woo Lee, Seoul (KR); Sun-Ghil Lee, Hwaseong-si (KR); Jin-Bum Kim, Seoul (KR); Joon-Gon Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 119 days.

(21) Appl. No.: 13/105,195

(22) Filed: May 11, 2011

(65) Prior Publication Data
US 2011/0306205 A1 Dec. 15, 2011

(30) Foreign Application Priority Data
Jun. 9, 2010 (KR) ........................ 10-2010-0054425

(51) Int. Cl.
*H01L 21/3205* (2006.01)
(52) U.S. Cl.
USPC .................................. 438/592; 257/E21.438
(58) Field of Classification Search
USPC .......... 438/592, 682, 655, 663; 257/E21.438, 257/E21.619, E21.634
See application file for complete search history.

(56) References Cited

U.S. PATENT DOCUMENTS

| 6,849,527 B1 | 2/2005 | Xiang |
| 7,566,605 B2 | 7/2009 | Shifren et al. |
| 7,902,612 B2 * | 3/2011 | Yamauchi et al. ............ 257/384 |
| 2008/0070370 A1 | 3/2008 | Wu et al. |
| 2009/0098665 A1 | 4/2009 | Bu et al. |

FOREIGN PATENT DOCUMENTS
KR 1020080108496 12/2008

* cited by examiner

*Primary Examiner* — Quoc Hoang
(74) *Attorney, Agent, or Firm* — Myers Bigel Sibley & Sajovec, P.A.

(57) ABSTRACT

Methods of forming a semiconductor device include providing a substrate having an area including a source and a drain region of a transistor. A nickel (Ni) metal film is formed on the substrate area including the source and the drain region. A first heat-treatment process is performed including heating the substrate including the metal film from a first temperature to a second temperature at a first ramping rate and holding the substrate including the metal film at the second temperature for a first period of time. A second heat-treatment process is then performed including heating the substrate including the metal film from a third temperature to a fourth temperature at a second ramping rate and holding the substrate at the fourth temperature for a second period of time. The fourth temperature is different from the second temperature and the second period of time is different from the first period of time. The sequentially performed first and second heat-treatment processes convert the Ni metal layer on the source and drain regions into a NiSi layer on the source and drain regions and a $NiSi_2$ layer between the NiSi layer and the source and drain regions.

16 Claims, 8 Drawing Sheets

SEMICONDUCTOR DEVICE AND METHOD OF FABRICATING THE SAME

This application claims priority from Korean Patent Application No. 10-2010-0054425 filed on Jun. 9, 2010 in the Korean Intellectual Property Office, the disclosure of which is incorporated herein by reference as if set forth in its entirety.

BACKGROUND

The present invention relates to a semiconductor devices and a methods of fabricating the same.

The remarkable development of silicon device fabrication technology has resulted in significant miniaturization of device size. Accordingly, contact regions such as gates, sources/drains, etc. have typically been scaled down, which may increase contact resistance and surface resistance. The increased contact resistance and surface resistance, which are generally accompanied by an increase in resistive-capacitive (RC) delay, may reduce the operating speed of the silicon devices.

To address this problem, a method of reducing surface resistance and contact resistance by forming silicide, which is a stable metal compound produced by the reaction between Si and metal, in contact regions such as gates, sources/drains, etc. has being used.

SUMMARY

Embodiments of forming a semiconductor device include providing a substrate having an area including a source and a drain region of a transistor. A nickel (Ni) metal film is formed on the substrate area including the source and the drain region. A first heat-treatment process is performed including heating the substrate including the metal film from a first temperature to a second temperature at a first ramping rate and holding the substrate including the metal film at the second temperature for a first period of time. A second heat-treatment process is then performed including heating the substrate including the metal film from a third temperature to a fourth temperature at a second ramping rate and holding the substrate at the fourth temperature for a second period of time. The fourth temperature is different from the second temperature and the second period of time is different from the first period of time. The sequentially performed first and second heat-treatment processes convert the Ni metal layer on the source and drain regions into a NiSi layer on the source and drain regions and a NiSi$_2$ layer between the NiSi layer and the source and drain regions.

In further embodiments, the fourth temperature is higher than the second temperature. The second temperature may be about 200° C. to about 450° C. and the fourth temperature may be about 850° C. to about 1100° C. The second ramping rate may be more rapid than the first ramping rate. The first ramping rate may be about 3° C./s to about 15° C./s and the second ramping rate may be at least 100,000° C./s. The second period of time may be shorter than the first period of time. The first period of time may be at least 30 seconds and the second period of time may be no more than 1 second.

In other embodiments, the performing of the first heat-treatment process forms an Ni$_2$Si layer in the first area of the substrate and the performing of the second heat-treatment process forms the NiSi layer and the NiSi$_2$ layer on the source and drain regions of the first area by changing a phase of the Ni$_2$Si layer.

In further embodiments, performing the second heat-treatment process is followed by annealing the substrate to adjust a thickness ratio of the NiSi layer to the NiSi$_2$ layer.

In yet other embodiments, the substrate further includes a second area defined therein and the method further includes, before forming the Ni metal film, implanting a first dose of N$_2$ into the second area of the substrate. The transistor in the first area comprises a first conductivity type transistor and a transistor of a second conductivity type comprising SiGe epitaxial layers is formed in the second area. The first dose may be from about 1×10$^{14}$ to 1×10$^{16}$ atoms/cm$^2$.

In further embodiments, the performing of the first heat-treatment process forms an Ni$_2$Si layer in the first area of the substrate and forms an Ni$_2$(GeSi) layer in the second area of the substrate. The performing of the second heat-treatment process forms the NiSi layer and the NiSi$_2$ layer on the source and drain regions of the first area by changing a phase of the Ni$_2$Si layer and forms an Ni(GeSi) layer in the second area of the substrate by changing a phase of the Ni$_2$(GeSi) layer.

In other embodiments, the method further includes annealing the substrate to adjust a ratio of the NiSi layer to the NiSi$_2$ layer. The first conductivity type may be an N type, and the second conductivity type may be a P type.

In yet further embodiments, methods of fabricating a semiconductor device include preparing a substrate in which a first area and a second area are defined. A metal film is formed on the substrate. A first heat-treatment process is performed by increasing a temperature of the substrate from a first temperature to a second temperature at a first ramping rate and heat-treating the substrate at the second temperature for a first period of time. A second heat-treatment process is performed by increasing the temperature of the substrate from a third temperature to a fourth temperature at a second ramping rate and heat-treating the substrate at the fourth temperature for a second period of time. A transistor of a first conductivity type is formed in the first area and a transistor of a second conductivity type, comprising SiGe epitaxial layers, is formed in the second area.

In other embodiments, forming the metal film is preceded by implanting a first dose of N$_2$ into the second area of the substrate.

In yet further embodiments, semiconductor devices include a substrate having an area including N+ source and drain regions of a transistor. A NiSi layer is on the N+ source and drain regions. A NiSi$_2$ layer is between the N+ source and drain regions and the NiSi layer.

In other embodiments, the substrate further includes a second area defined therein and the semiconductor device further includes SiGe epitaxial layers in the second area of the substrate and a Ni(GeSi) layer on the SiGe epitaxial layers. A thickness ratio of the NiSi layer and the NiSi$_2$ layer may be selected to provide a reduced contact resistance to the N+ source and drain regions.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION OF THE EMBODIMENTS

Figure 1:
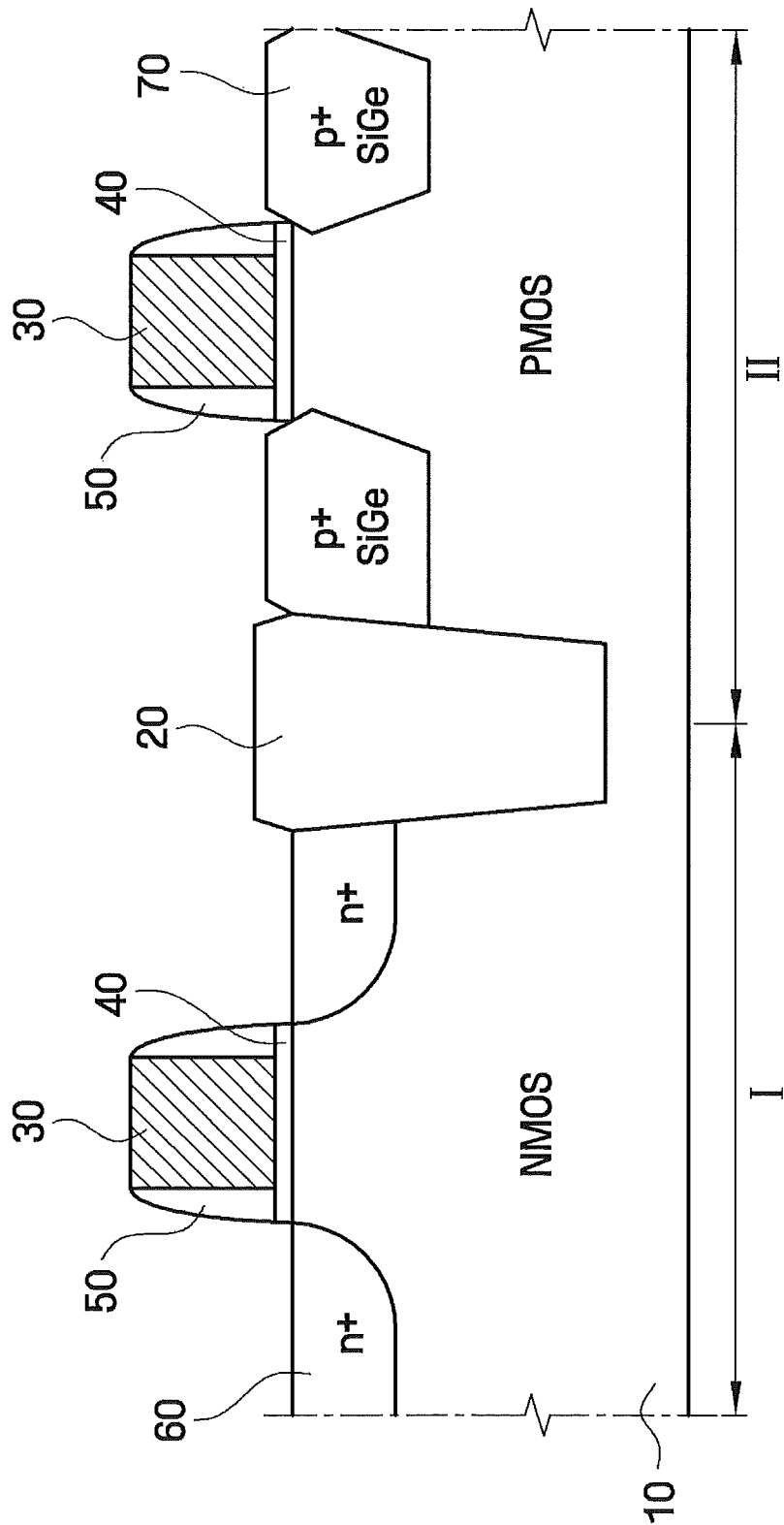
FIGS. 1 through 6 are cross-sectional views of a semiconductor device illustrating a method of fabricating a semiconductor device according to some embodiments of the present invention.

Advantages and features of the present invention and methods of accomplishing the same may be understood more readily by reference to the following detailed description of exemplary embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. In the drawings, sizes and relative sizes of elements may be exaggerated for clarity.

Like reference numerals refer to like elements throughout the specification. As used herein, the term "and/or" includes any and all combinations of one or more of the associated listed items.

As used herein, the singular forms "a", "an" and "the" are intended to include the plural forms as well, unless the context clearly indicates otherwise. It will be further understood that the terms "comprises" and/or "made of," when used in this specification, specify the presence of stated components, steps, operations, and/or elements, but do not preclude the presence or addition of one or more other components, steps, operations, elements, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments of the invention are described herein with reference to plan and cross-section illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a method of fabricating a semiconductor device according to some embodiments of the present invention will be described with reference to FIGS. 1 through 7.

FIGS. 1 through 6 are cross-sectional views of a semiconductor device at different intermediate stages included in a method of fabricating a semiconductor device according to some embodiments of the present invention. FIG. 7 is a cross-sectional view of a semiconductor device according to some embodiments of the present invention.

Referring to FIG. 1, a substrate 10 in which a first area I and a second area II are defined is prepared. Specifically, a transistor which has a first conductivity type (e.g., an N type) is formed in the first area I of the substrate 10, and a transistor which has a second conductivity type (e.g., a P type) and has SiGe epitaxial layers 70 is formed in the second area II of the substrate 10.

More specifically, an insulating film (not shown) and a gate electrode layer (not shown), which may be made of a material, such as polysilicon, may be sequentially formed on the Si-containing substrate 10. Then, the gate electrode layer and the insulating film may be patterned as shown in FIG. 1 by using, for example, photolithography and etching processes, thereby forming a gate insulating film 40 and a gate electrode 30 on the substrate 10. Thereafter, spacers 50 may be formed on sidewalls of the gate electrode 30.

A device isolation region 20, which separates the first area I from the second area II, may be formed. The device isolation region 20 may be, e.g., a shallow trench isolation (STI) region.

Impurities may be ion-implanted into the first area I of the substrate 10 by using the gate electrode 30 and the gate insulating film 40 as a mask, thereby forming N+-doped source and drain regions 60. In addition, trenches (not shown) may be formed in the second area II of the substrate 10, and the SiGe epitaxial layers 70 may be grown in the trenches. The SiGe epitaxial layers 70 may be formed to apply compressive stress to a channel of the transistor of the second conductivity type (e.g., the P type). The SiGe epitaxial layers 70 may be P+-doped to serve as source and drain regions of the transistor of the second conductivity type (e.g., the P type).

Although not shown in the drawing, P+-doped source and drain regions may be formed to overlap the SiGe epitaxial layers 70. Also, N+- or P+-doped source and drain regions, each of which is divided into a lightly doped region (not shown) and a heavily doped region (not shown), may be formed. That is, the present invention is not limited to the illustration in FIG. 1.

Figure 2:
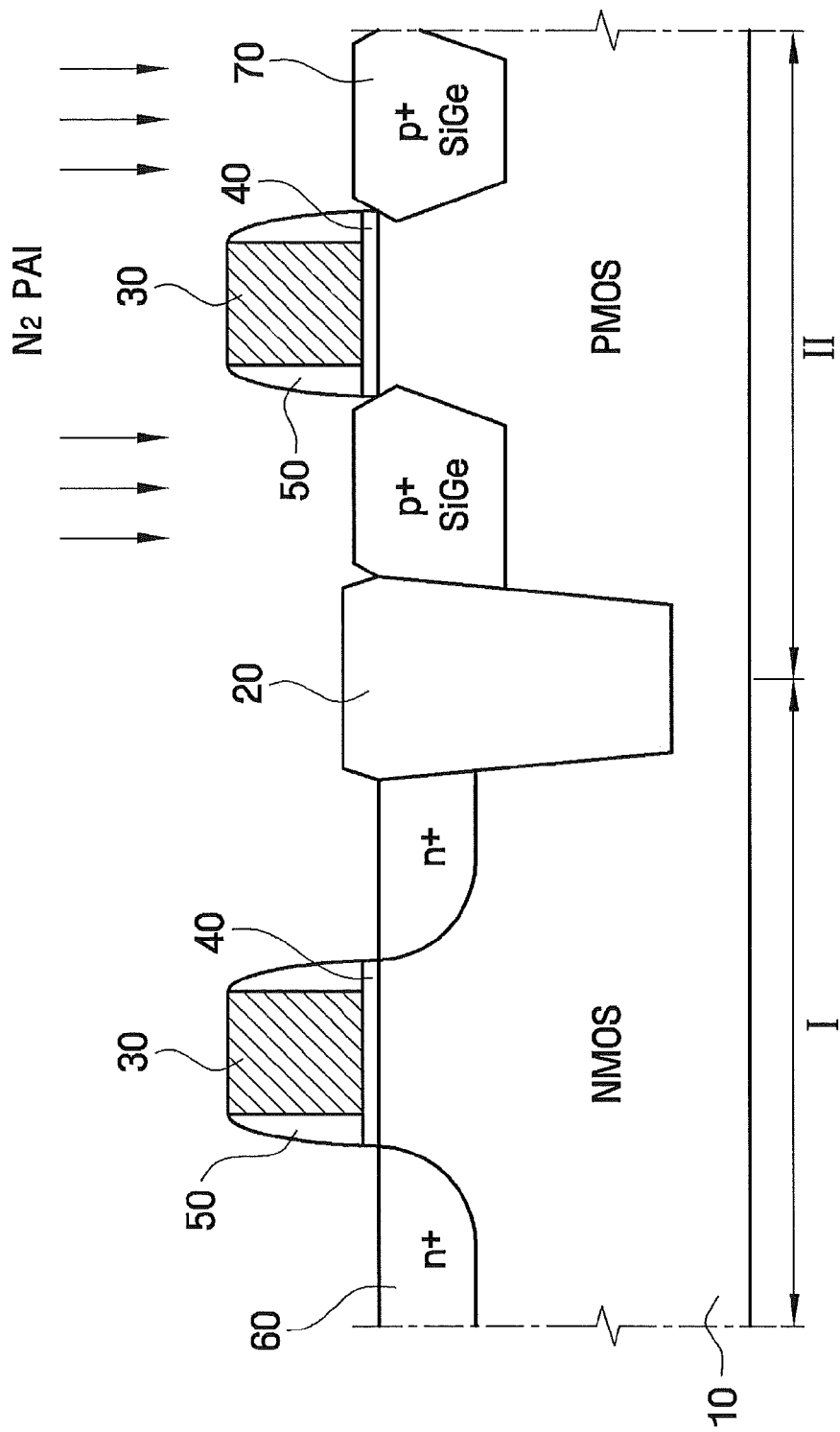

Referring to FIG. 2, $N_2$ is implanted into the second area II of the substrate 10. In the method of fabricating a semiconductor device according to some embodiments of the present invention, $N_2$ may be implanted only into the second area II of the substrate 10.

Specifically, a pre-amorphous implant (PAI) process may be performed on the second area II of the substrate 10 by using $N_2$. The PAI process using $N_2$ may be performed with, for example, an energy of about 20 keV or less and a dose of about $1 \times 10^{14}$ to $1 \times 10^{16}$ atoms/cm$^2$.

After the PAI process, an annealing process may be performed to cure defects resulting from the PAI process.

Figure 3:
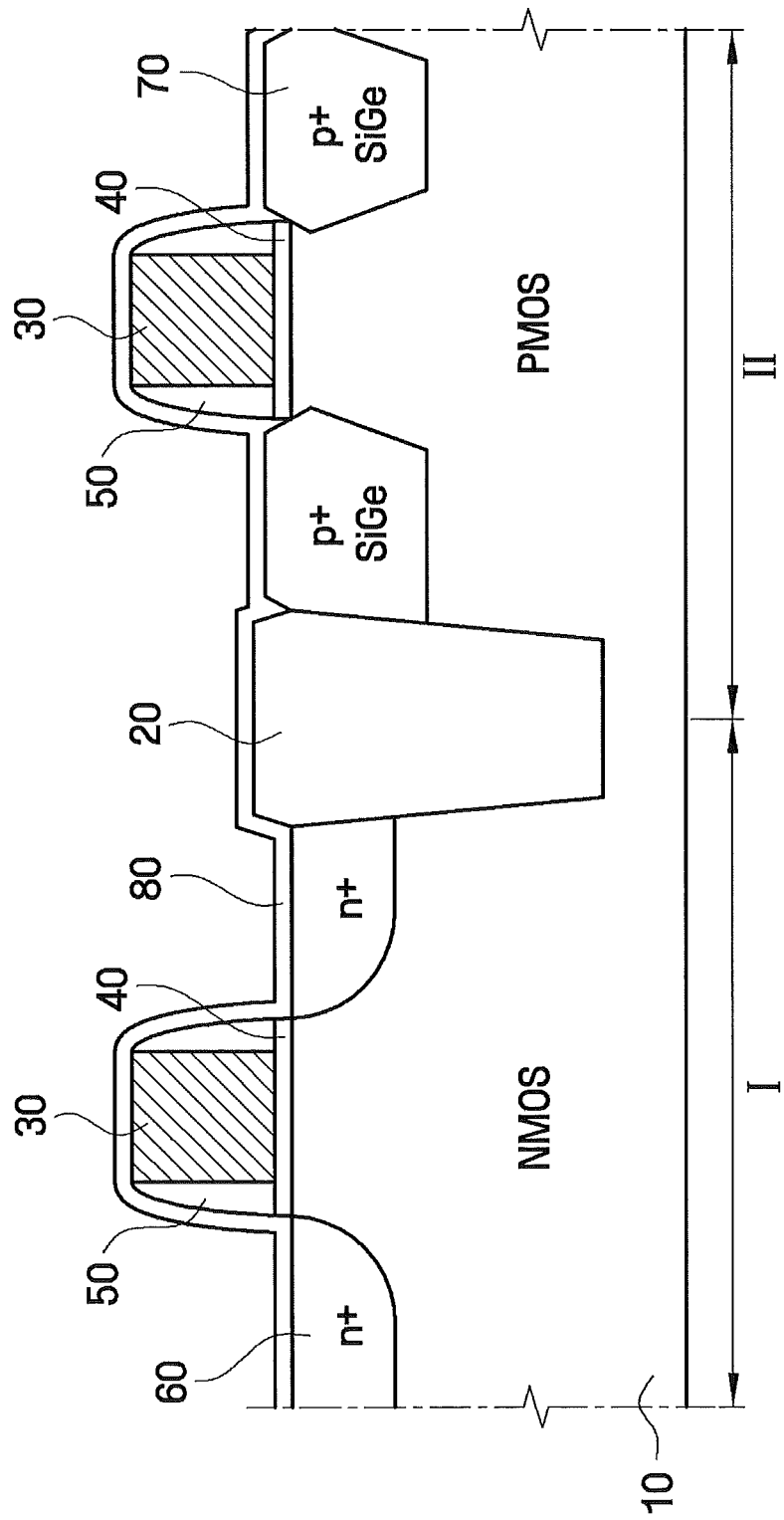

Referring now to FIG. 3, a metal film 80 is shown formed on the substrate 10. The metal film 80 may be an Ni metal film. The metal film 80 may be formed by using an apparatus, such as an e-beam evaporator, sputtering, chemical vapor deposition (CVD), physical vapor deposition (PVD), metal-organic chemical vapor deposition (MOCVD) and/or molecular beam epitaxy (MBE). Methods that can be used to form the metal film 80 are not limited to the above methods. That is, any method can be used as long as the Ni Metal film 80 can be deposited.

Figure 4:
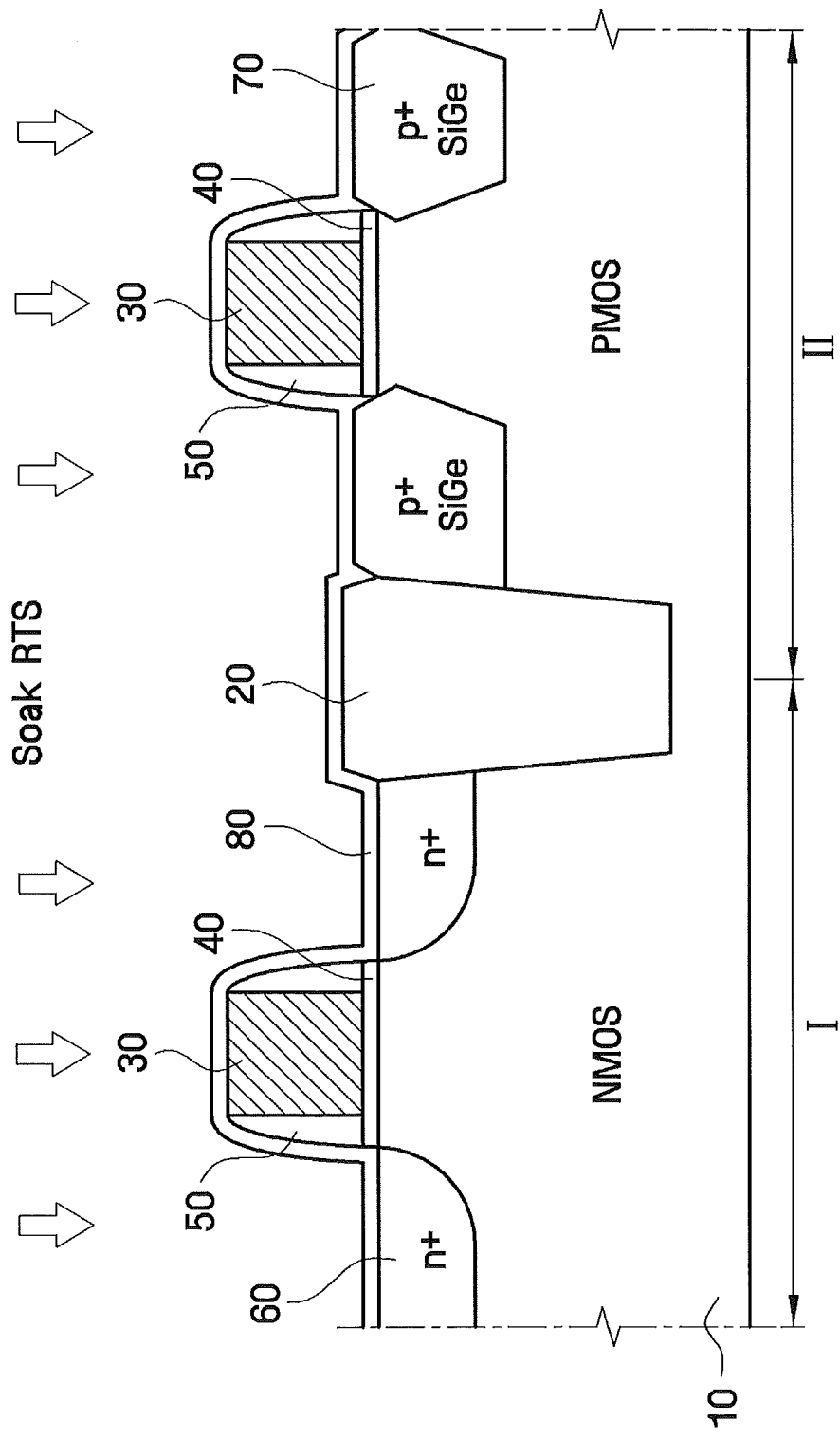

Referring now to FIG. 4, a first heat-treatment process may be performed. That is, in some embodiments, the temperature of the substrate 10 is increased from a first temperature to a second temperature at a first ramping rate. Then, the substrate 10 is heat-treated at the second temperature for a first period of time. The first temperature may be room temperature. The second temperature may range from about 200° C. to about 450° C. In addition, the first period of time may be in a range of about 30 seconds to about 1 minute.

As described above, the temperature of the substrate 10 may be increased from the first temperature to the second temperature at the first ramping rate. The first ramping rate may be about 15° C./s or less. In further embodiments, the first ramping rate may range from about 3 to about 15° C./s. As the temperature of the substrate 10 is increased at this ramping rate, the first heat-treatment process can be a soak rapid thermal silicide (RTS).

Figure 5:
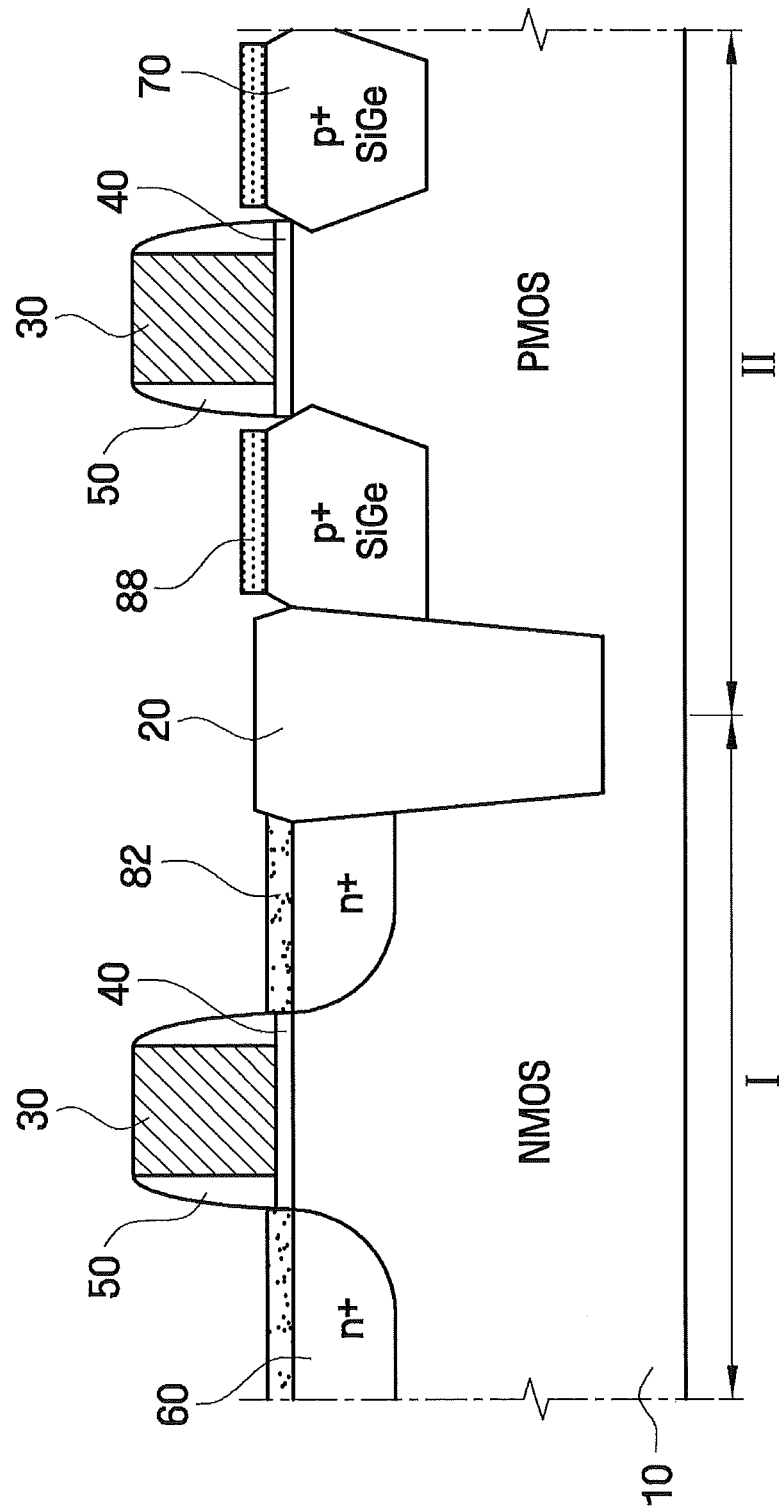

Referring now to FIG. 5, after the first heat-treatment process, the metal film 80 is selectively removed, leaving portions thereof on the source and drain regions 60 and the SiGe epitaxial layers 70 (i.e., source and drain regions). As shown in FIG. 5, the metal film 80 (see FIG. 4) formed on the N+ source and drain regions 60 may be transformed into an $Ni_2Si$ layer 82 by the first heat-treatment process, and the metal film 80 (see FIG. 4) formed on the P+ SiGe epitaxial layers 70 may be transformed into an $Ni_2(GeSi)$ layer 88 by the first heat-treatment process.

Figure 6:
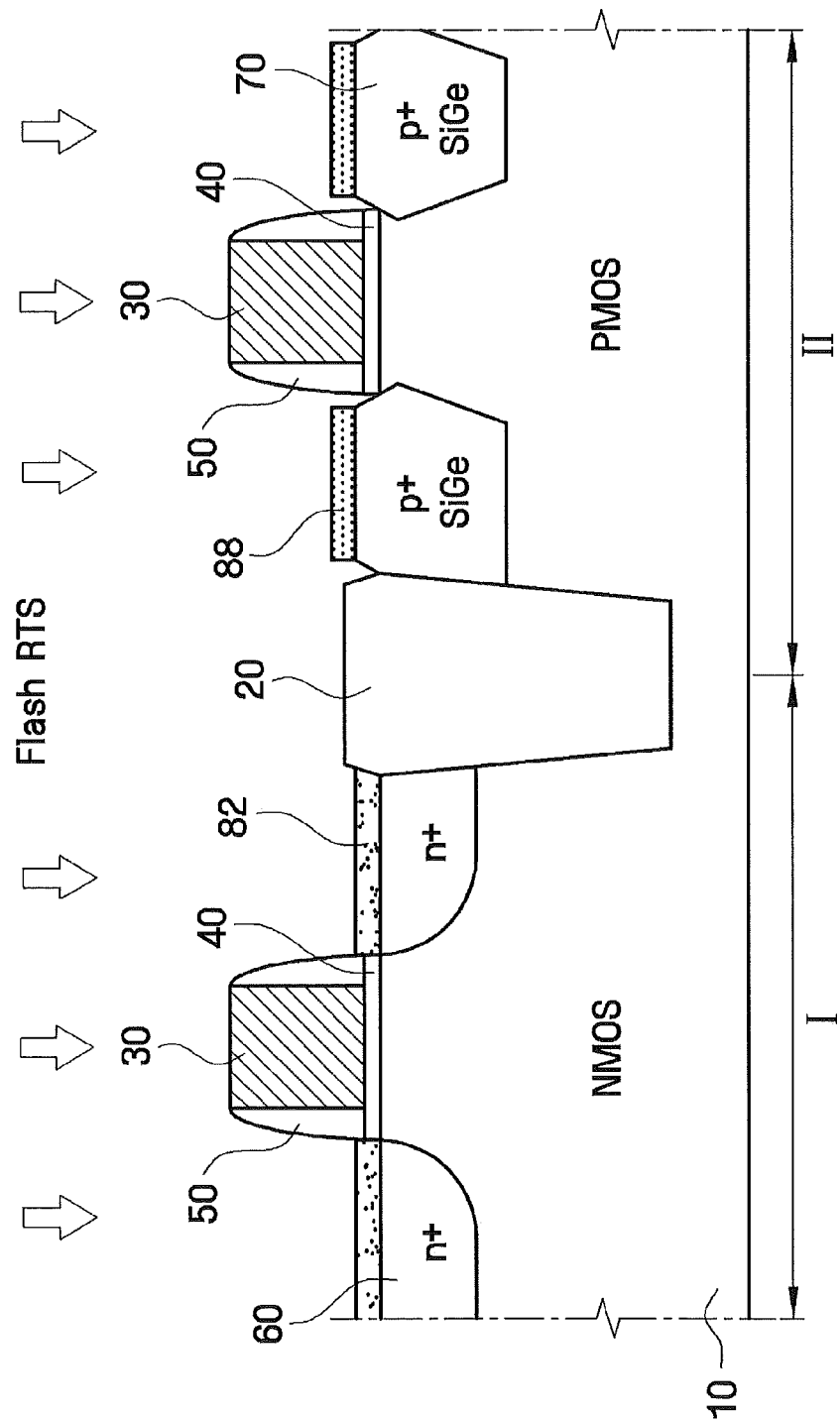
Figure 7:
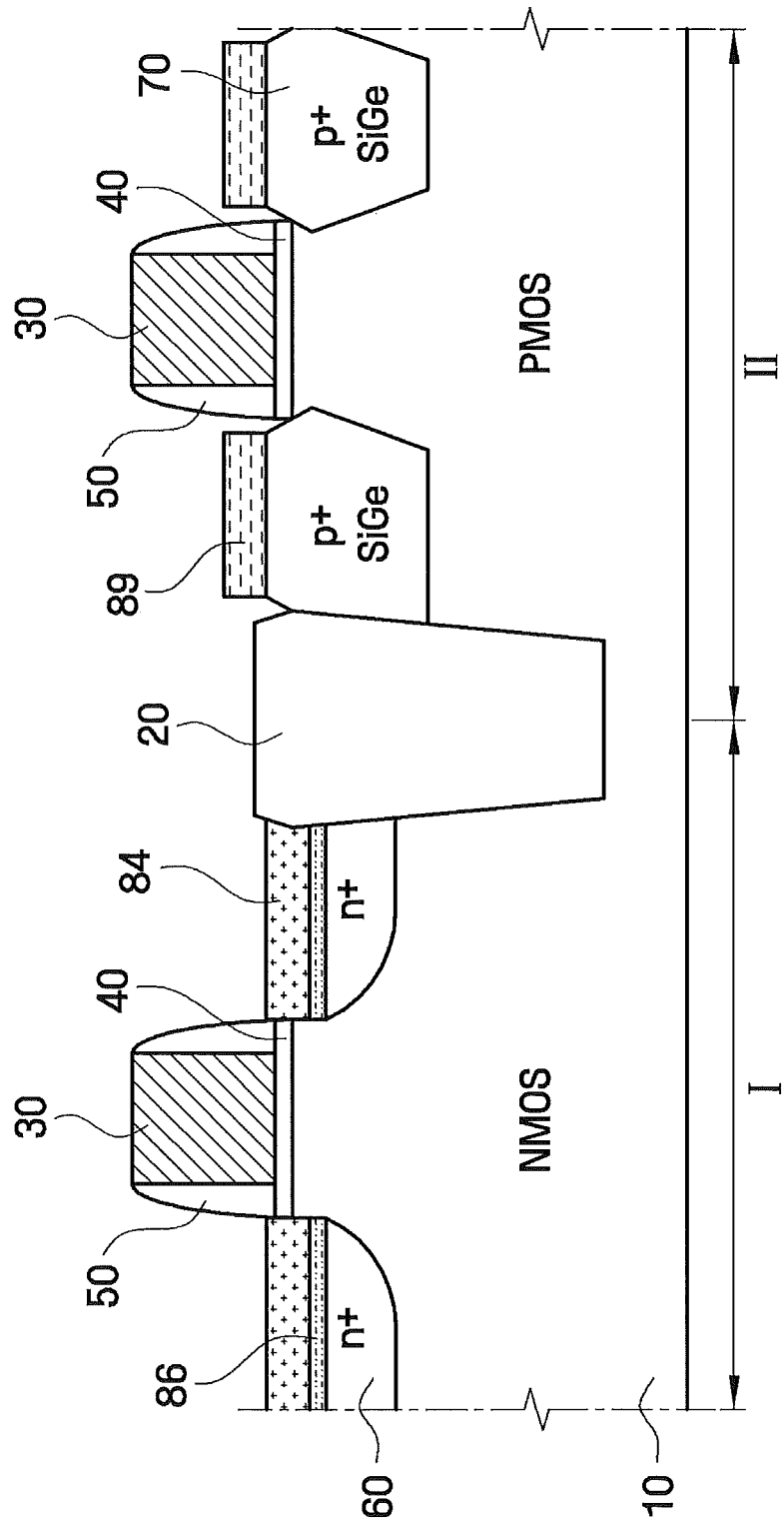
FIG. 7 is a cross-sectional view of a semiconductor device according to some embodiments of the present invention.

Referring now to FIG. 6, a second heat-treatment process may be performed. That is, in some embodiments, the temperature of the substrate 10 is increased from a third temperature to a fourth temperature at a second ramping rate. Then, the substrate 10 is heat-treated at the fourth temperature for a second period of time. The third temperature may be room temperature. The fourth temperature may range from about 850° C. to about 1100° C. The second period of time may be less than about 1 second.

Differently from the first heat-treatment process described above, in the second heat-treatment process, the temperature of the substrate 10 may be increased from the third temperature to the fourth temperature at the second ramping rate. Here, the second ramping rate may be 100,000° C./s or more. As the temperature of the substrate 10 is increased at this ramping rate, the second heat-treatment process can be a flash RTS. The second heat-treatment process is different from the first heat-treatment process in that the temperature of the substrate 10 is increased to a higher temperature at a higher ramping rate.

Referring now to FIG. 7, the phase of the $Ni_2Si$ layer 82 (see FIG. 6) may be changed by the second heat-treatment process to form an NiSi layer 84. In addition, an $NiSi_2$ layer 86 may be formed between the N+ source and drain regions 60 and the NiSi layer 84 as a result of the second heat treatment process. As shown in the drawing, the $NiSi_2$ layer 86 is formed at an interface between the N+ source and drain regions 60, which may reduce contact resistance. This will be described in more detail later.

The phase of the $Ni_2(GeSi)$ layer 88 (see FIG. 6) may also be changed by the second heat-treatment process to form an Ni(GeSi) layer 89. As shown in the drawing, the Ni(GeSi) layer 89 is also formed at an interface of the P+ SiGe epitaxial layers 70 (i.e., the source and drain regions), thereby reducing contact resistance. This will also be described in more detail later.

Although not shown in the drawings, an annealing process may also be performed after the second heat-treatment process. The annealing process may be designed to adjust a depth ratio of the NiSi layer 84 to the $NiSi_2$ layer 86.

Hereinafter, a method of fabricating a semiconductor device according to further embodiments of the present invention will be described with reference to FIGS. 1 and 3 through 7.

The fabrication method according to further embodiments is different from the previously described fabrication method in the following aspects.

Referring to FIG. 1, a substrate 10 in which a first area I and a second area II are defined is prepared. A transistor that has a first conductivity type (e.g., an N type) is formed in the first area I of the substrate 10, and a transistor which has a second conductivity type (e.g., a P type) and has nitrogen (N)-doped SiGe epitaxial layers 70 is formed in the second area II of the substrate 10. That is, the N-doped SiGe epitaxial layers 70 are grown in the method of fabricating a semiconductor device according to these further embodiments. Therefore, the PAI process using $N_2$ may not be performed on the second area II of the substrate 10 in the fabrication method according to these further embodiments. Subsequent processes illustrated in FIGS. 3 through 7 may be substantially the same as those included in the fabrication method described above. Therefore, a redundant description thereof is omitted.

A semiconductor device according to some embodiments of the present invention will now be described with reference to FIG. 7.

The illustrated semiconductor device according to some embodiments as seen in FIG. 7 may include a substrate 10 in which a first area I and a second area II are defined. N+ regions 60 are formed in the first area I of the substrate 10 and an NiSi layer 84 is formed on the N+ regions 60. An $NiSi_2$ layer 86 is formed between the N+ regions 60 and the NiSi layer 84. P+ SiGe epitaxial layers 70 are formed in the second area II of the substrate 10 and an Ni(GeSi) layer 89 is formed on the P+ SiGe epitaxial layers 70.

The $NiSi_2$ layer 86 and the Ni(GeSi) layer 89, respectively formed on the N+ regions 60 and the P+ SiGe epitaxial layers 70 (i.e., source and drain regions) in the semiconductor device, according to some embodiments, may reduce contact resistance, thereby improving characteristics of the semiconductor device.

Figure 8:
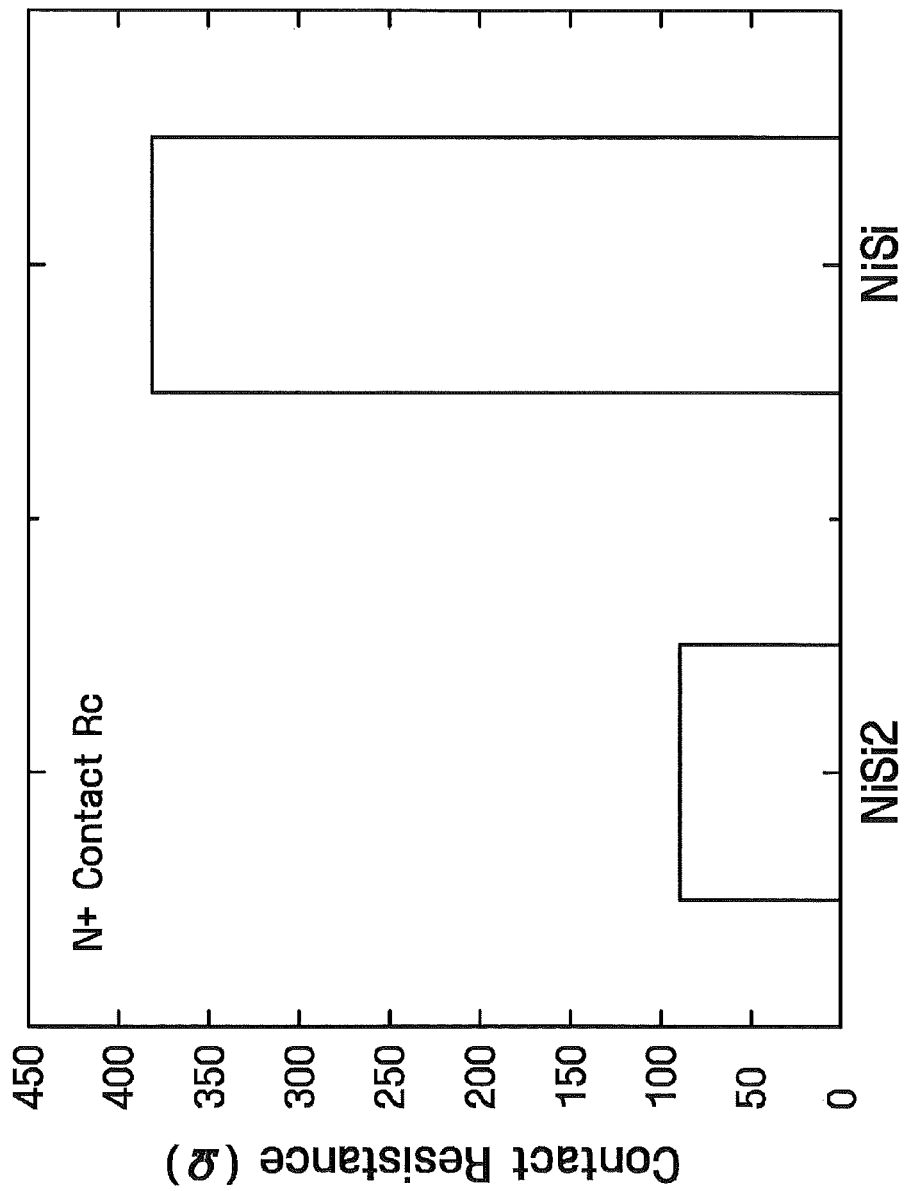
FIG. 8 is a graph illustrating effects brought about by a semiconductor device and a method of fabricating the same according to some embodiments of the present invention.

Improvements in the performance of a semiconductor device fabricated using a fabrication method according to some embodiments of the present invention will now be described with reference to FIG. 8. FIG. 8 is a graph illustrating effects brought about by a semiconductor device and a method of fabricating the same according to some embodiments of the present invention.

NiSi silicide is phase-changed into $Ni_2Si$, NiSi, and $NiSi_2$ according to heat-treatment conditions. As $NiSi_2$ has a lower N+ contact resistance than NiSi, as shown in FIG. 8, it can improve operating characteristics of a semiconductor device (e.g., a transistor). In addition, the thermal stability of $NiSi_2$ is excellent compared with NiSi. Thus, $NiSi_2$ can contribute to the stability of the semiconductor device (e.g., a transistor). Further, Ni(GeSi) silicide, which reduces P+ contact resistance, can improve the operating characteristics of the semiconductor device (e.g., a transistor).

In view of the above facts, a semiconductor device fabricated using a fabrication method according to some embodiments of the present invention can have improved operating characteristics as an $NiSi_2$ layer is formed between N+ regions and an NiSi layer and an Ni(GeSi) layer is formed on P+ SiGe epitaxial layers.

According to an aspect of the present invention, there is provided a method of fabricating a semiconductor device. The method includes: preparing a substrate in which a first area and a second area are defined; implanting a first dose of $N_2$ into the second area of the substrate; forming a metal film on the substrate; performing a first heat-treatment process by increasing a temperature of the substrate from a first temperature to a second temperature at a first ramping rate and heat-treating the substrate at the second temperature for a first period of time; and performing a second heat-treatment process by increasing the temperature of the substrate from a third temperature to a fourth temperature at a second ramping rate and heat-treating the substrate at the fourth temperature for a second period of time, wherein a transistor of a first conductivity type is formed in the first area, and a transistor of a second conductivity type comprising SiGe epitaxial layers, is formed in the second area.

According to another aspect of the present invention, there is provided a method of fabricating a semiconductor device. The method includes: preparing a substrate in which a first area and a second area are defined; forming a metal film on the substrate; performing a first heat-treatment process by increasing a temperature of the substrate from a first temperature to a second temperature at a first ramping rate and heat-treating the substrate at the second temperature for a first period of time; and performing a second heat-treatment process by increasing the temperature of the substrate from a third temperature to a fourth temperature at a second ramping rate and heat-treating the substrate at the fourth temperature for a second period of time, wherein a transistor of a first conductivity type is formed in the first area, and a transistor of a second conductivity type comprising nitrogen(N)-doped SiGe epitaxial layers, is formed in the second area.

According to another aspect of the present invention, there is provided a semiconductor device including: a substrate in which a first area and a second area are defined; N+ regions which are formed in the first area of the substrate; an NiSi layer which is formed on the N+ regions; an $NiSi_2$ layer which is formed between the N+ regions and the NiSi layer; SiGe epitaxial layers which are formed in the second area of the substrate; and an Ni(GeSi) layer which is formed on the SiGe epitaxial layers.

The foregoing is illustrative of the present invention and is not to be construed as limiting thereof. Although a few embodiments of the present invention have been described, those skilled in the art will readily appreciate that many modifications are possible in the embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A method of forming a semiconductor device, the method comprising:
    providing a substrate having an area including a source and a drain region of a transistor;
    forming a nickel (Ni) metal film on the substrate area including the source and the drain region; and
    performing a first heat-treatment process, including:
        heating the substrate including the metal film from a first temperature to a second temperature at a first ramping rate; and
        holding the substrate including the metal film at the second temperature for a first period of time; and then
    performing a second heat-treatment process, including:
        heating the substrate including the metal film from a third temperature to a fourth temperature at a second ramping rate; and
        holding the substrate at the fourth temperature for a second period of time, wherein the fourth temperature is different from the second temperature and the second period of time is different from the first period of time wherein the fourth temperature is higher than the second temperature;
    wherein the sequentially performed first and second heat-treatment processes convert the Ni metal layer on the source and drain regions into a NiSi layer on the source and drain regions and a $NiSi_2$ layer between the NiSi layer and the source and drain regions.

2. The method of claim 1, wherein the second temperature is about 200° C. to about 450° C. and the fourth temperature is about 850° C. to about 1100° C.

3. The method of claim 1, wherein the second ramping rate is more rapid than the first ramping rate.

4. The method of claim 3, wherein the first ramping rate is about 3° C./s to about 15° C./s, and the second ramping rate is at least 100,000° C./s.

5. The method of claim 3, wherein the second period of time is shorter than the first period of time.

6. The method of claim 5, wherein the first period of time is at least 30 seconds and the second period of time is no more than 1 second.

7. The method of claim 5, wherein the performing of the first heat-treatment process forms an $Ni_2Si$ layer in the area of the substrate and wherein the performing of the second heat-treatment process forms the NiSi layer and the $NiSi_2$ layer on the source and drain regions of the area by changing a phase of the $Ni_2Si$ layer.

8. The method of claim 1, wherein performing the second heat-treatment process is followed by annealing the substrate to adjust a thickness ratio of the NiSi layer to the $NiSi_2$ layer.

9. The method of claim 1, wherein the area is a first area and wherein the substrate further includes a second area defined therein and wherein the method further comprises, before forming the Ni metal film, implanting a first dose of $N_2$ into the second area of the substrate and wherein the transistor in the first area comprises a first conductivity type transistor and wherein a transistor of a second conductivity type comprising SiGe epitaxial layers, is formed in the second area.

10. The method of claim 9, wherein the first dose is from about $1 \times 10^{14}$ to $1 \times 10^{16}$ atoms/cm$^2$.

11. The method of claim 9, wherein the performing of the first heat-treatment process forms an Ni$_2$Si layer in the first area of the substrate and forms an Ni$_2$(GeSi) layer in the second area of the substrate.

12. The method of claim 11, wherein the performing of the second heat-treatment process forms the NiSi layer and the NiSi$_2$ layer on the source and drain regions of the first area by changing a phase of the Ni$_2$Si layer and forms an Ni(GeSi) layer in the second area of the substrate by changing a phase of the Ni$_2$(GeSi) layer.

13. The method of claim 12, further comprising annealing the substrate to adjust a ratio of the NiSi layer to the NiSi$_2$ layer.

14. The method of claim 9, wherein the first conductivity type comprises an N type, and the second conductivity type comprises a P type.

15. A method of fabricating a semiconductor device, the method comprising:

preparing a substrate in which a first area and a second area are defined;

forming a metal film on the substrate;

performing a first heat-treatment process by increasing a temperature of the substrate from a first temperature to a second temperature at a first ramping rate and heat-treating the substrate at the second temperature for a first period of time; and performing a second heat-treatment process by increasing the temperature of the substrate from a third temperature to a fourth temperature at a second ramping rate and heat-treating the substrate at the fourth temperature for a second period of time, wherein a transistor of a first conductivity type is formed in the first area, and a transistor of a second conductivity type comprising SiGe epitaxial layers, is formed in the second area.

16. The method of claim 15, wherein forming the metal film is preceded by implanting a first dose of N$_2$ into the second area of the substrate.

* * * * *